United States Patent
Schmitt et al.

(10) Patent No.: US 10,830,571 B2
(45) Date of Patent: Nov. 10, 2020

(54) TECHNIQUES FOR MAGNETIC FIELD DIRECTION BASED POSITION SENSOR

(71) Applicant: Analog Devices International Unlimited Company, Limerick (IE)

(72) Inventors: Jochen Schmitt, Biedenkopf (DE); Enda Joseph Nicholl, Kilmallock (IE)

(73) Assignee: Analog Devices International Unlimited Company, Limerick (IE)

( * ) Notice: Subject to any disclaimer, the term of this patent is extended or adjusted under 35 U.S.C. 154(b) by 26 days.

(21) Appl. No.: 15/957,652

(22) Filed: Apr. 19, 2018

(65) Prior Publication Data

US 2018/0306567 A1  Oct. 25, 2018

Related U.S. Application Data

(60) Provisional application No. 62/487,335, filed on Apr. 19, 2017, provisional application No. 62/520,887, filed on Jun. 16, 2017.

(51) Int. Cl.
*G01B 7/00* (2006.01)
*G01D 5/14* (2006.01)
*G01R 33/06* (2006.01)

(52) U.S. Cl.
CPC ........... *G01B 7/003* (2013.01); *G01D 5/145* (2013.01); *G01D 5/147* (2013.01); *G01R 33/06* (2013.01)

(58) Field of Classification Search
CPC ........ G01B 7/003; G01D 5/145; G01D 5/147; G01R 33/06
See application file for complete search history.

(56) References Cited

U.S. PATENT DOCUMENTS

| | | | |
|---|---|---|---|
| 2,339,299 A | 1/1944 | Smith et al. | |
| 4,764,767 A | 8/1988 | Ichikawa et al. | |
| 6,020,736 A * | 2/2000 | Aoyama | G01D 5/147 324/207.21 |
| 7,804,210 B2 * | 9/2010 | O'Day | G01D 5/244 310/12.01 |
| 10,012,518 B2 * | 7/2018 | David | G01D 5/142 |

(Continued)

FOREIGN PATENT DOCUMENTS

DE  10038296 A1  8/2002
EP  1477772    11/2004

OTHER PUBLICATIONS

"Integrated AMR Angle Sensor and Signal Conditioner", Analog Devices—ADA4571, (2017), 8 pgs.

(Continued)

*Primary Examiner* — Dominic E Hawkins
(74) *Attorney, Agent, or Firm* — Schwegman Lundberg & Woessner, P.A.

(57) ABSTRACT

Techniques for sensing position using a magnetic field direction sensor are provided. In an example, a system can include a magnet, a first magnetic field direction sensor, positioned between the magnet and a magnetic feature of a first structure, the sensor configured to move with the magnet and to measure a direction of a magnetic field produced by the magnet relative to a first axis (x). In certain examples, the magnetic feature is configured change position with respect to the magnetic sensor along the first axis (x) as a relative position between the magnet and the magnetic feature changes with respect to a second axis (y).

18 Claims, 9 Drawing Sheets

(56) References Cited

U.S. PATENT DOCUMENTS

| | | | |
|---|---|---|---|
| 2011/0175601 A1* | 7/2011 | Bogos | G01D 5/14 |
| | | | 324/207.25 |
| 2014/0197820 A1 | 7/2014 | Ritter et al. | |
| 2015/0022187 A1* | 1/2015 | Taylor | G01B 7/146 |
| | | | 324/207.2 |
| 2015/0022197 A1* | 1/2015 | David | G01R 33/02 |
| | | | 324/251 |
| 2016/0123774 A1* | 5/2016 | Foletto | G01D 5/145 |
| | | | 324/207.21 |
| 2017/0268903 A1* | 9/2017 | Kranz | G01B 7/003 |
| 2017/0284836 A1* | 10/2017 | Aichriedler | G01D 5/12 |
| 2018/0017412 A1* | 1/2018 | Eagen | G01D 5/165 |
| 2019/0056241 A1* | 2/2019 | Vuillermet | G01D 5/145 |

OTHER PUBLICATIONS

"International Application PCT IB2018 000492, International Search Report dated Aug. 23, 2018", 4 pgs.
"International Application PCT IB2018 000492, Written Opinion dated Aug. 23, 2018", 7 pgs.

* cited by examiner

TECHNIQUES FOR MAGNETIC FIELD DIRECTION BASED POSITION SENSOR

PRIORITY AND RELATED APPLICATIONS

This patent application claims the benefit of priority of Schmitt, U.S. Provisional Patent Application Ser. No. 62/520,887, entitled "TECHNIQUES FOR MAGNETIC FIELD DIRECTION BASED POSITION SENSOR," filed on Jun. 16, 2017, and Schmitt, U.S. Provisional Patent Application Ser. No. 62/487,335, entitled "TECHNIQUES FOR MAGNETIC FIELD DIRECTION BASED POSITION SENSOR," filed on Apr. 19, 2017, each of which is hereby incorporated by reference herein in its entirety.

BACKGROUND

Fine, incremental, position sensing has been performed using several types of sensing and encoding such as optical encoding. Position sensing can also be performed using absolute analog sensors like potentiometers. However, potentiometers usually have a sliding or rolling contact, which makes them susceptible to wear over long-term use. Furthermore, analog devices are inherently noisy, leading to positional inaccuracies, and their output is often digitized to be useful, which can limit resolution. Some digital, absolute position sensors have been proposed that make use of separate power supplies to maintain their absolute position after an origin is established. Others make use of computationally inefficient lookup tables that map the unique states of a sensor to a unique position over multiple turns.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
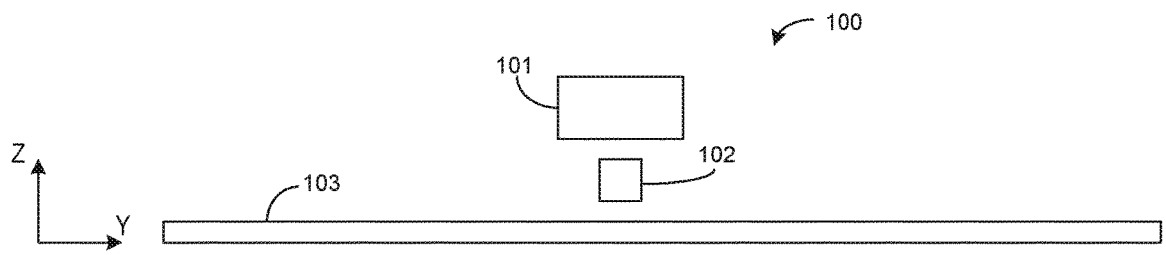
FIG. 1A-1C illustrate generally a layout of an example position sensor system.
Figure 1B:
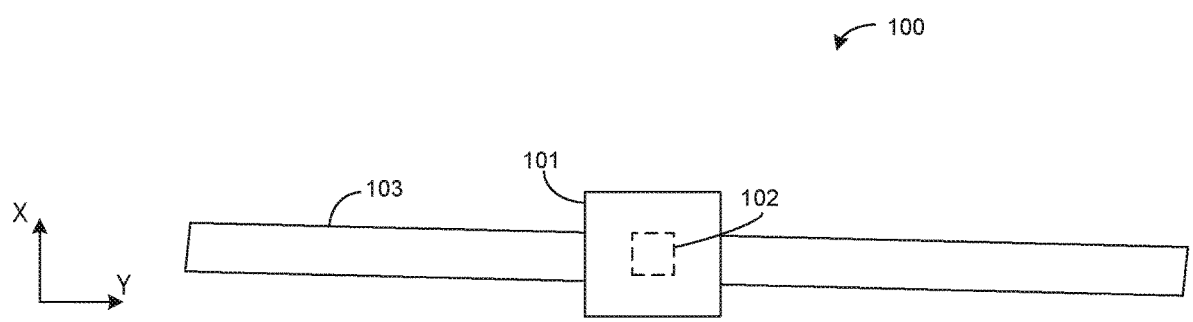
Figure 1C:
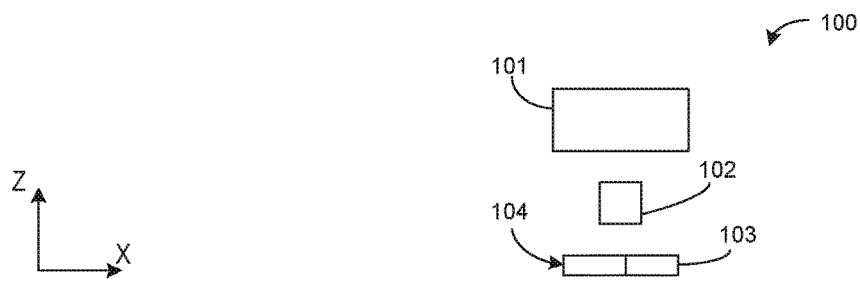

The present inventors have recognized techniques for a non-contact position sensor that uses magnetic field direction to encode either incremental position changes or absolute position. FIG. 1A-1C illustrate generally a layout of an example position sensor system 100. In certain examples, the system 100 can include a magnet 101, a magnetic field direction sensor 102, and a structure 103 including a magnetic feature. The magnet 101 can provide a magnetic field. The magnetic feature of the structure 103 can effect the orientation of the magnetic field, and the magnetic field direction sensor 102 can provide an indication of the magnetic field direction. In certain examples, the magnetic field direction sensor 102 can move with the magnet 101, or can be mounted with the magnet 101 such that the relative position between the magnet 101 and the magnetic field direction sensor 102 does not change. The structure 103, or more particularly, the magnetic feature of the structure 103 can be arranged such that as the relative position between the structure 103 and the magnet 101 changes in a first direction, the magnetic feature moves relative to the magnetic field direction (MFD) sensor 102 in a second direction.

For example, the magnet 101 and MFD sensor 102 can be mounted to a first portion of a machine, a second structure of the machine can include the magnetic feature, and the first and second portions of the machine can be designed to move along, for example, the y-axis, relative to each other. In such an application, the MFD sensor 102 can provide a signal indicative of the relative position of one portion of the machine with respect to the other. In certain examples, the magnetic feature can represent some discontinuity or change in a magnetic property of the structure 103. The feature may be an edge of a soft magnetic material such as materials that are easily magnetized and demagnetized. Soft magnetic materials typically have intrinsic coercivity less than 1000 Am-1. In some examples, a magnetic feature can include an edge 104 of a ferromagnetic material or a radius of a ferromagnetic material. In some examples, the magnetic feature can be an edge or radius associated with a conductor or a superconductor. As discussed above, and as shown in FIGS. 1B and 1C, the magnetic feature, or edge of the structure 103, can be arranged such that as the magnet 101 and MFD sensor 102 move in the y-direction, the edge 104 move relative to the MFD sensor 102 in the x-direction. Such change in x-direction relative position can correspond to an associated change in magnetic field direction at the MFD sensor 102. Consequently the MFD sensor 102 can provide position information of the first portion of the machine relative to the second portion and vice-versa based on the detected direction of the magnetic field at the MFD sensor 102.

As illustrated in FIG. 1, the magnetic feature can be skewed with respect to the direction of travel or the y-axis. In certain examples, the amount of skew is intentionally arranged such that the magnetic field direction detected by the magnetic field direction sensor can be correlated to the position of the magnetic feature along the y-axis with respect to the position of the magnet or magnetic field direction sensor. In certain examples, the output of the magnetic field sensor can be analogous to the output of an encoder and can be used to provide position information as discussed above or to provide position feedback to a motion control system moving the magnet and magnetic field sensor or moving the structure including the magnetic feature.

In certain example, the structure including the magnetic feature can be a structure having an opening or slot, and the magnetic feature can include the edge of the slot.

Figure 2C:
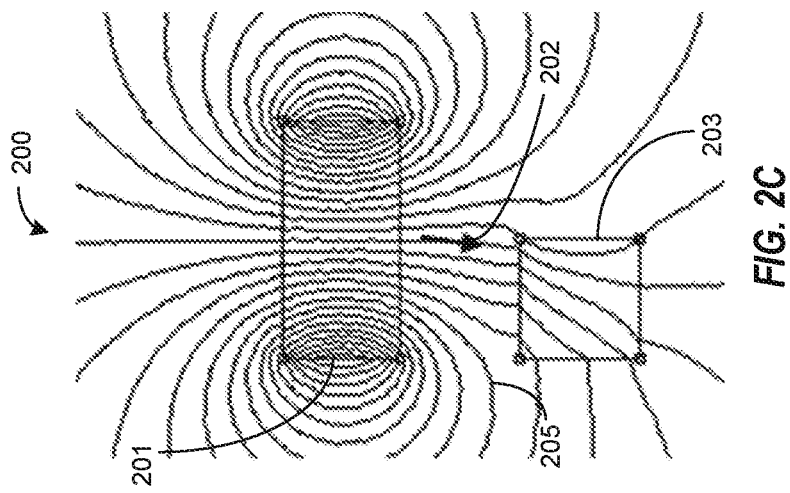
FIG. 2A-2C illustrate generally how an example arrangement of devices can provide position information.
Figure 2B:
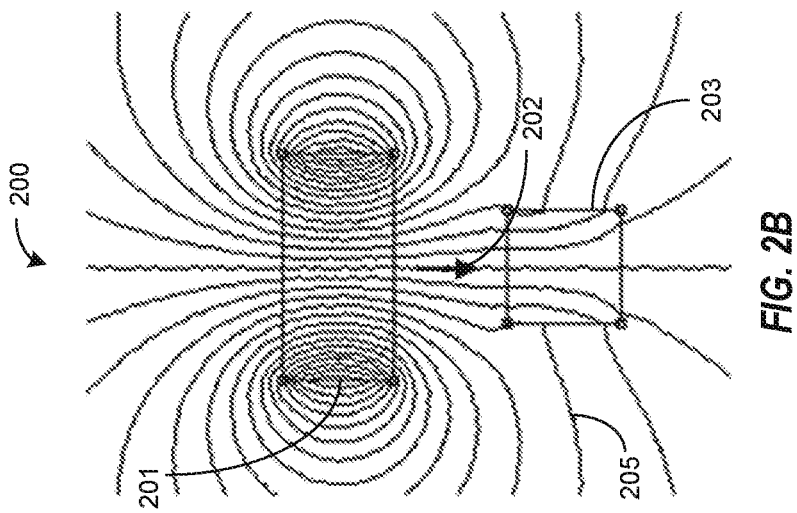
Figure 2A:
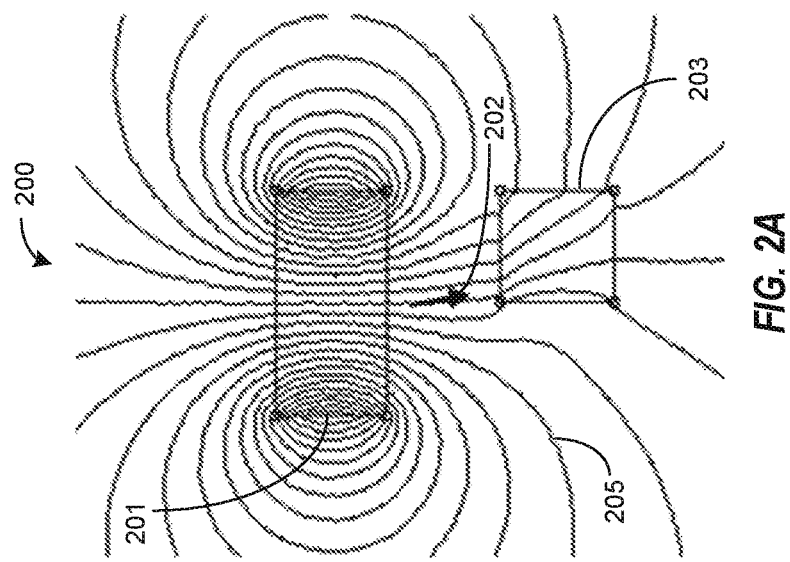

FIG. 2A-2C illustrate generally how an example arrangement of a magnet 201, MFD sensor 202, and structure 203 including magnetic feature can provide position information. FIGS. 2A-2C illustrate generally an example position system 200 with an overlay indicating magnetic field lines 205. The position system 200 can include a magnet 201, a MFD sensor 202 represented by an arrow and a structure 203 with a magnetic feature. Although not limited as such, the structure 203 can be a bar made of ferromagnetic material and the magnetic feature can be the edge of the bar. In FIG. 2A, the magnet 201 and MFD sensor 202 are positioned over the structure 203 at a first end of the structure 203 and the structure 203 is shown in a cross-section view. In FIG. 2A, the structure 203, at the first end, is arranged to be offset, for example to the right of center of the magnet 201 and MFD sensor 202. The MFD sensor 202 is shown as an arrow that can be indicative of an output of the MFD sensor 202 and the value of the output is indicative of a direction of the magnetic field lines 205 detected by the MFD sensor 202.

FIG. 2B illustrates generally the arrangement of the position system 200 when the magnet 201 and MFD sensor 202 are position over a midpoint of the structure 203. In certain examples, the magnet 201 and MFD sensor 202 can approach the illustrated location by moving, with respect to the structure 203, away from the first end of the structure 203 toward the midpoint of the structure 203 and along a direction perpendicular with the plane of the drawing. In some examples, the arrangement of the position system 200 illustrated in FIG. 2B can be a result of the structure 203 moving, with respect to the magnet 201 and MFD sensor 202, in a direction perpendicular with the plane of the drawing and into the plane of the drawing. At the position shown in FIG. 2B, the cross section location of the magnetic feature of the structure 203 has moved to the left with respect to the magnet 201 and the MED sensor 202 compared to FIG. 2A. The location of the magnetic feature influences the direction of the magnetic field at the MFD sensor 202 such that the magnetic field direction, and the output of the MED sensor 202, is different than that illustrated in FIG. 2A.

FIG. 2C illustrates generally the arrangement of the position system 200 when the magnet 201 and MFD sensor 202 are located over a second end of the structure 203 distal from the first end of the structure 203. At the illustrated position, the cross-section location of the magnetic feature of the structure 203 has moved further to the left with respect to the magnet 201 and the MFD sensor 202 than that illustrated in FIGS. 2A and 2B. The location of the magnetic feature influences the direction of the magnetic field at the MED sensor 202 such that the magnetic field direction, and the output of the MED sensor 202, is different than that illustrated in FIGS. 2A and 2B. Thus, with a position system 200 designed according to the present subject matter, the output of the MED sensor 202 can provide position information indicative of the relative displacement of the structure 203 with respect to the magnet 201 and MED sensor 203 along the axis of relative motion.

Figure 3:
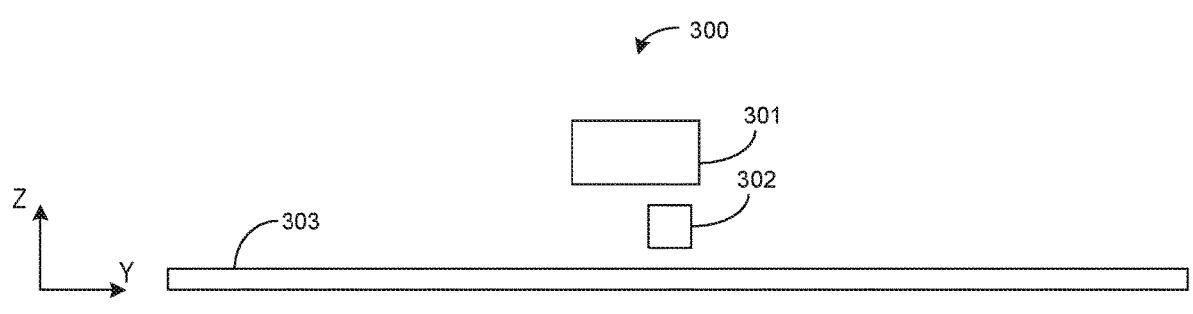
FIG. 3 illustrates generally an alternative, example arrangement of a magnet and an MFD sensor in an example position sensor system.

FIG. 3 illustrates generally an alternative, example arrangement of a magnet 301 and an MFD sensor 302 in an example position sensor system 300. The example arrangement has the MED sensor 302 located off-center of the magnet 301 in the direction of movement of the magnet 301 with respect to the magnetic feature. When the MED sensor 302 is located at a midpoint or centerline of the magnet, magnetic field direction information with respect to y-axis change is minimal and in many cases not useful. Thus, with the MED sensor 302 located at a midpoint or centerline of the magnet 301, the magnetic field direction information can be limited to the x-z plane. However, with the MED sensor 302 positioned off-center of the magnet 301 as described above, field direction change in the y-axis becomes more pronounced and the output of the MED sensor 302 can include useful magnetic field direction information in the x-y plane.

Figure 4A:
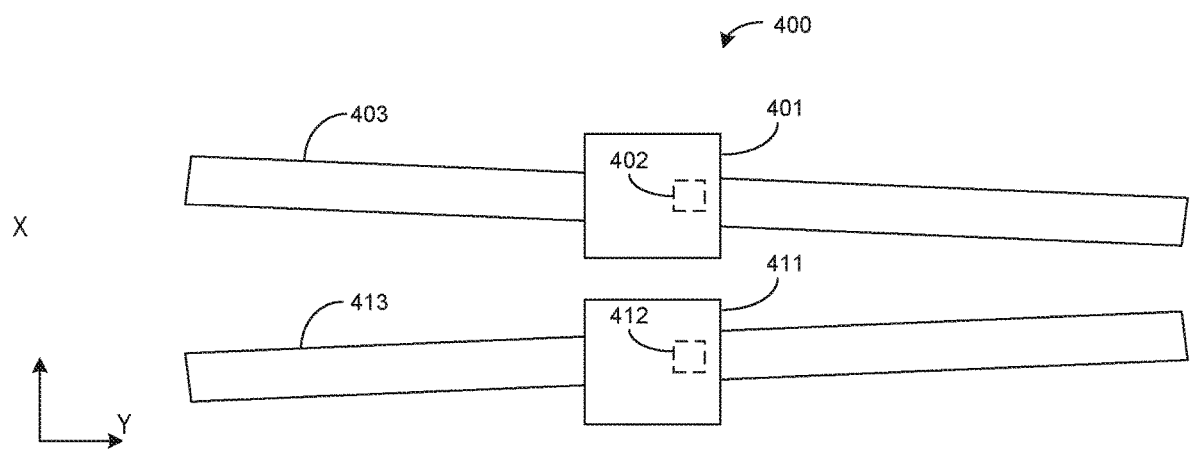
FIGS. 4A and 4B illustrate generally an example multi-sensor position system.
Figure 4B:
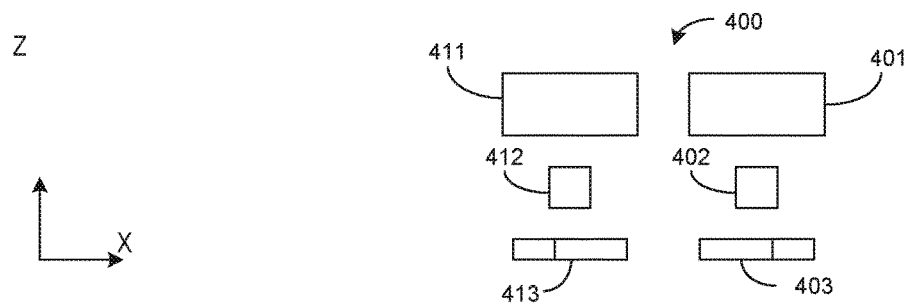

FIGS. 4A and 4B illustrate generally an example multi-sensor position system 400. In certain examples, the system 400 can include two magnets 401 411, two MFD sensors 402, 412 and one or more structures 403, 413 each having a magnetic feature skewed at opposite angles relative to a direction of interest (y). FIG. 4A illustrates a top-view of the multi-sensor position system 400. FIG. 4B illustrates an end-view of the multi-sensor position system 400. In certain examples, x-axis misalignment of the magnetic features of the structures 403, 413, the magnets 401, 411 or the MFD sensors 402, 412 can be cancelled by processing the difference between the angle signals provided by the MFD sensors 402, 412. In some examples, a single magnet can be used instead of the two illustrated magnets 401, 411.

Figure 5:
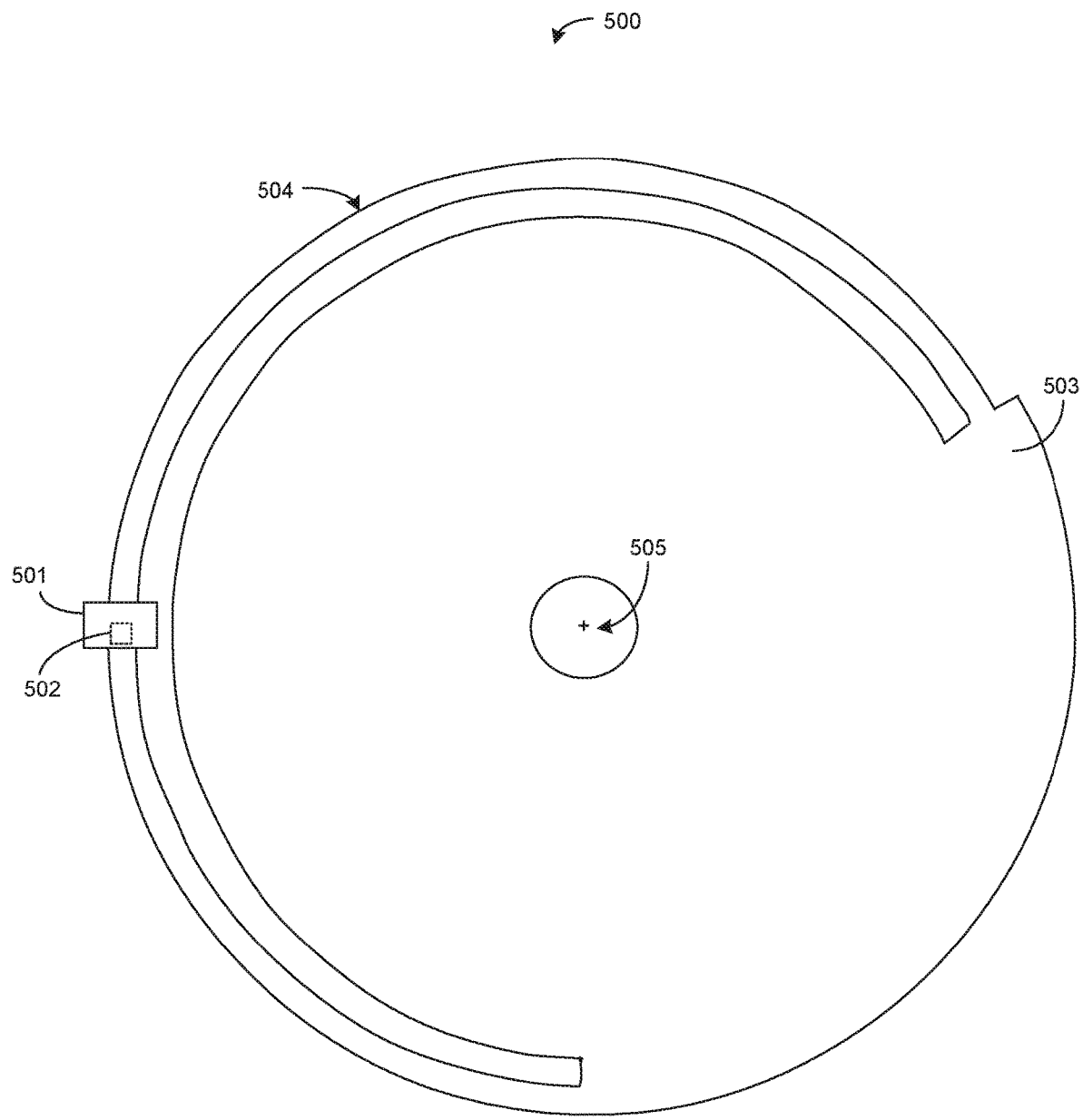
FIG. 5 illustrate generally an example position sensor system for a rotary axis of motion.

FIGS. 5A and 5B illustrate generally and example position sensor system 500 for a rotary axis of motion. The position sensor system 500 can include a magnet 501, a MFD sensor 502 and a structure including a curved magnetic feature 504. In certain examples, the curved magnetic feature 504 can be in the form of an Archimedean spiral so as to provide radial skew as the position of magnetic feature changes with respect to the magnetic field direction sensor via rotational motion. As the relative rotational position changes between the magnet 501 and the structure 503 having the magnetic feature 504, the radial position of the magnetic feature 504 can change with respect to the magnet 501 and the MFD sensor 502. As the relative radial position of the magnetic feature changes, the magnetic field direction can also change and be detected by the MFD sensor 502. The output of the MFD sensor 502 can be processed to determine the actual rotational position information of the structure 503 about the axis 505 or incremental position information of the structure 503 about the axis 505.

Figure 6:
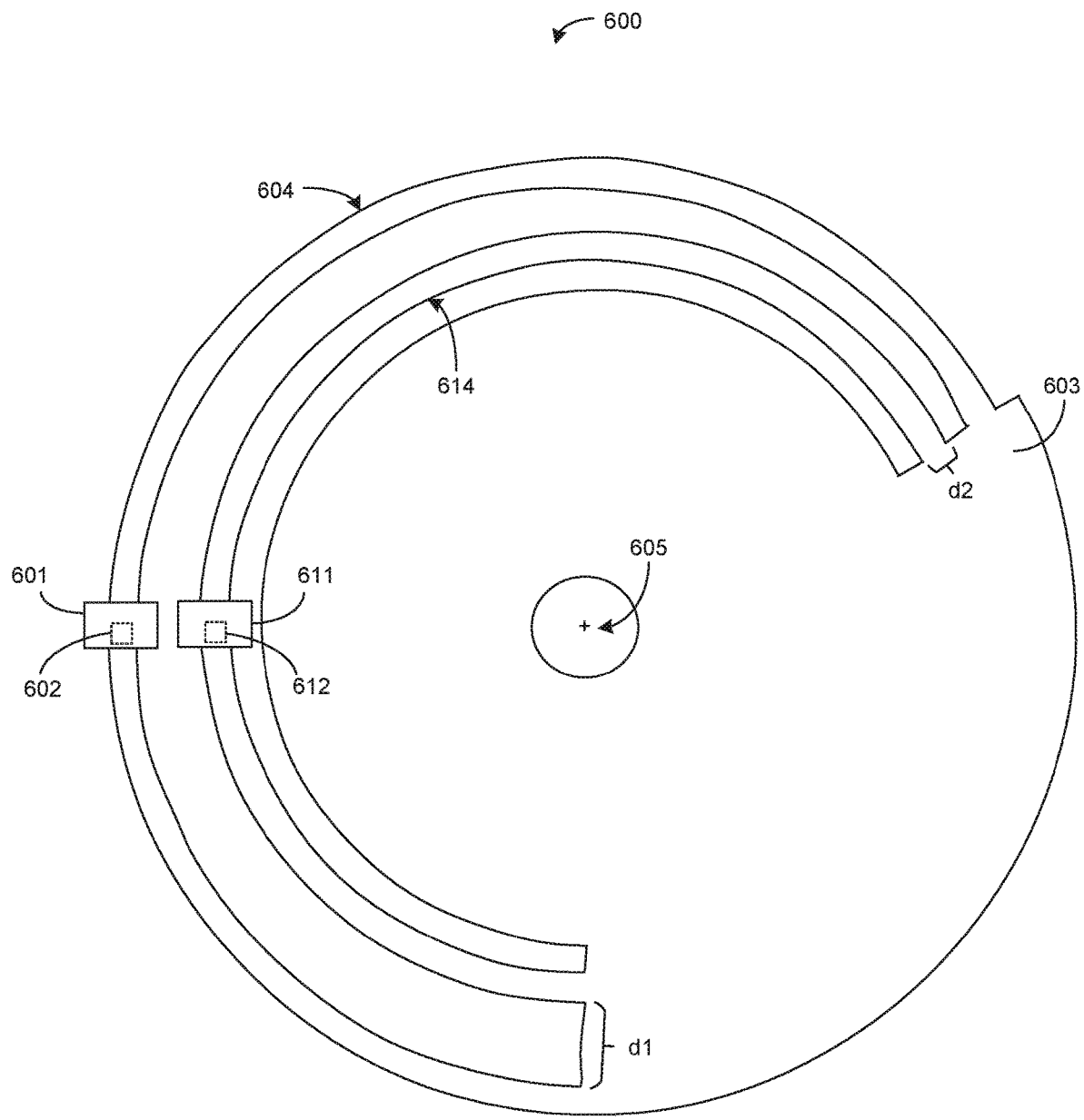
FIG. 6 illustrates generally an example rotary position sensor system that can eliminate unintentional eccentricity anomalies.

FIG. 6 illustrates generally an example rotary position sensor system 600 that can eliminate unintentional eccentricity anomalies. The rotary position sensor system 600 can include two magnets 601, 611, two MFD sensors 602, 612, and two magnetic features 601, 614. The magnetic features 604, 614 can change radius in a spiral fashion about the axis, however, the polarity of the radius change of one magnetic feature can be opposite the polarity of radius change of the other magnetic feature such that the spacing (d1) between the magnetic features 604, 614 at one end is larger than the spacing (d2) of the magnetic features 604, 614 at the other end. In certain examples, radial or eccentric misalignment of the magnetic features 304, 614, the magnets, or the MFD sensors 602, 612 can be cancelled by processing the difference of the angle signals provided by the MFD sensors 602, 612. In some examples, a single magnet can be used instead of the two illustrated magnets 601, 611.

Whether measuring rotational position of an axis or linear position of an axis, greater skew of the magnetic feature can provide higher resolution of the position information provided by the MFD sensor. In certain examples, the MFD sensor can have a limited sensing range, thus greater skew of the magnetic feature may also limit the range of detectable motion of an axis. In certain examples of a multiple sensor position system, a first magnetic feature can span the entire desired travel range and provide course position information and a set of second magnetic feature, with sharper skew that the first magnetic feature can be serially laid out over the desired travel range to provide high resolution position information.

Figure 7:
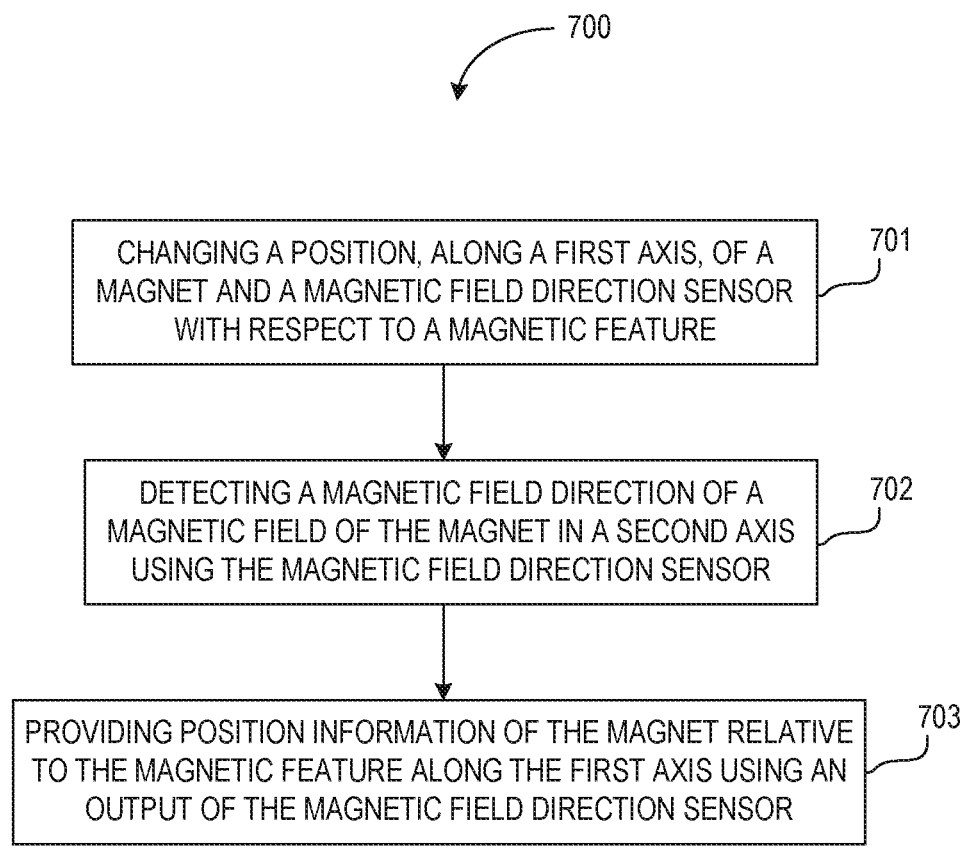
FIG. 7 illustrates generally a flow chart of an example method for providing position information of a system.

FIG. 7 illustrates generally a flow chart of an example method 700 for providing position information of a system. In certain examples, at 701, position of a magnet and a magnetic field direction sensor of the system can change with respect to a magnetic feature of the system. For example, the magnet and magnetic field direction sensor can be mounted to a first structure of the system and the magnetic feature can be a feature of or mounted to a second structure of the system. In certain examples, knowledge or availability of the relative position of the first structure with respect to the second structure can provide useful information for the system. Such a system, for example, can be a piece of manufacturing equipment, a contact sensor, test equipment, medical equipment, a part of a machine, etc. At 703, the magnetic field direction sensor can detect the direction of the magnetic field of the magnet, for example, along a second axis. In certain examples, the magnetic feature can influence the direction of the magnetic field of the magnet. As the position of the magnet and magnetic feature changes, the magnetic field direction sensor can detect the magnetic field direct. At 705, the magnetic field direction sensor can provide position information of the magnet with respect to the magnetic feature. In certain examples, the position information can include the magnetic field direction.

Figure 8:
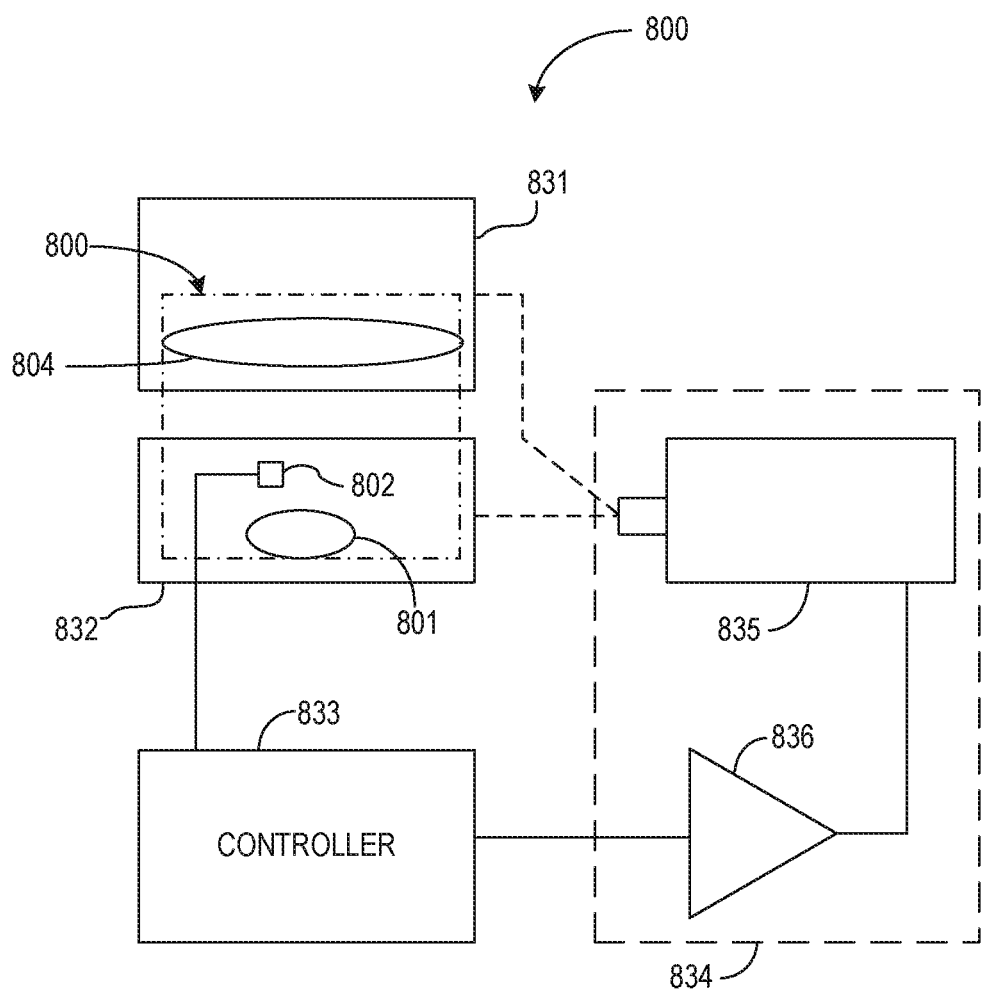
FIG. 8 illustrates generally a system that includes an example position system.

FIG. 8 illustrates generally a system 830 that includes an example position system 800. The system 830 can include a first structure 831, a magnetic feature 804 of the first structure 831 or mounted to the first structure 831, a second structure 832, a magnet 801, a magnetic field direction sensor 802, and a controller 833. The system 830 can allow motion between the first structure 831 and second structure 832. In certain examples, the motion can be accomplished manually. In certain examples, the motion can be linear motion along an axis. In some examples, the motion can be rotational motion. In certain examples, the motion can be accomplished using an optional motion system 834 to drive at least one of the first structure 831 or the second structure 832. In some examples, the motion system 834 can include an actuator 835 and an amplifier 836 to drive the actuator 835. The controller 833 can provide a command signal to the amplifier 836. The amplifier 836 can control the actuator 835. The actuator 835 can move the first structure 831 or the second structure 832. In some examples, the combination of the example position system 800 and the optional motion system 834 can allow the motion between the first structure 831 and the second structure 832 to be controlled in a closed loop which can provide very precise positioning, velocity control, acceleration control, jerk control, or combinations thereof.

Applications utilizing one or more of the concepts shown in any one or more of the preceding figures can include, but are not limited to, liquid level detection, rotary seat position, linear seat position, rotary table position, linear table position, robotic arm position (either rotary or linear displacement), yolk position detection, joystick position detection, rotary die position, linear die position, pick and place axis position, linear displacement measurement, rotary displacement measurement, rotary motor shaft position, linear motor displacement position, or combinations thereof.

Figure 9:
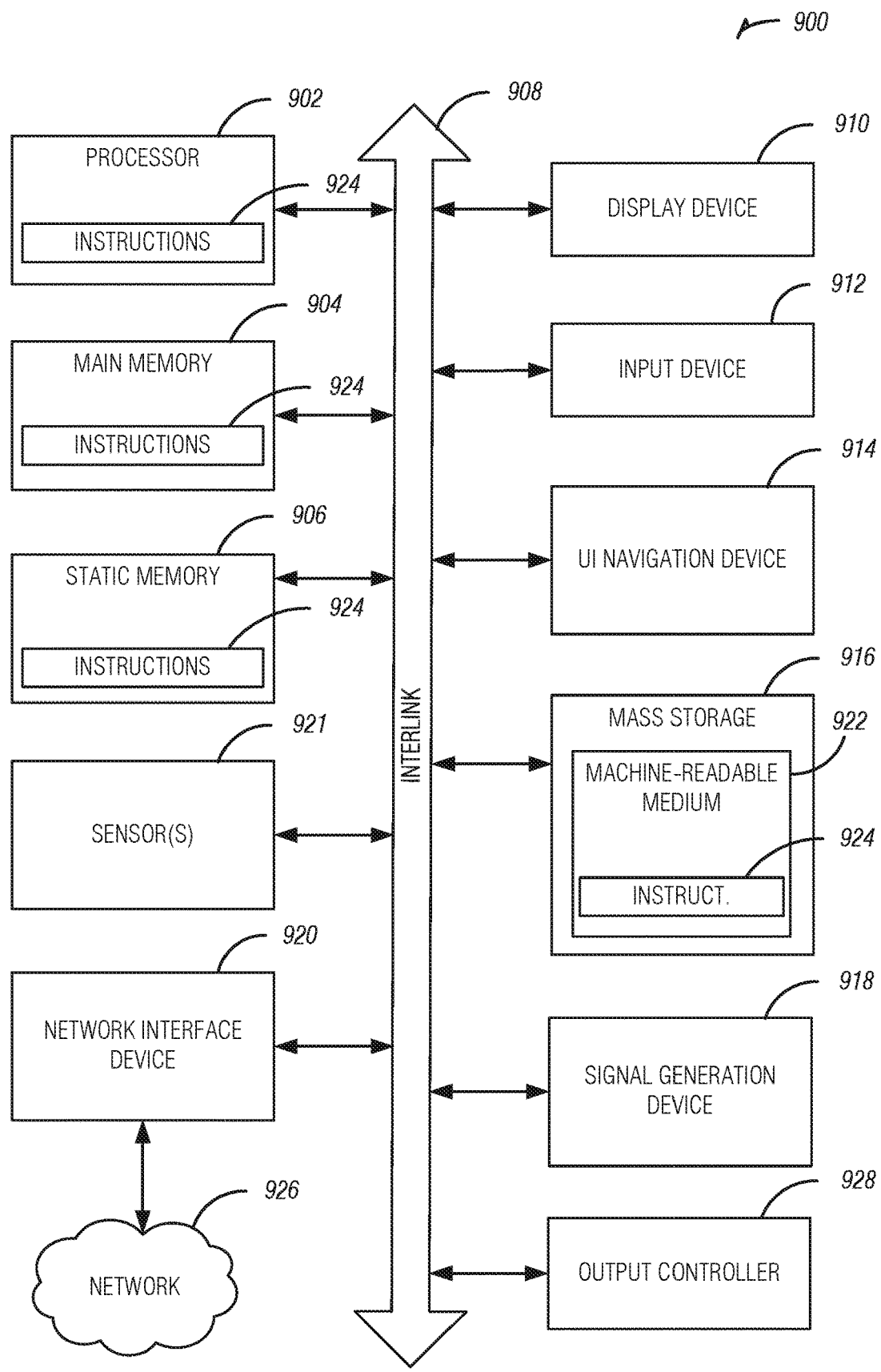
FIG. 9 illustrates a block diagram of an example machine upon which any one or more of the techniques (e.g., methodologies) discussed herein may perform.

FIG. 9 illustrates a block diagram of an example machine 900, or controller, upon which any one or more of the techniques (e.g., methodologies) discussed herein may perform. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (or other distributed) network environment. As used herein, peer-to-peer refers to a data link directly between two devices (e.g., it is not a hub-and-spoke topology). Accordingly, peer-to-peer networking is networking to a set of machines using peer-to-peer data links. The machine 900 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Machine (e.g., computer system) 900 may include a hardware processor 902 (e.g., a central processing unit (CPU), a graphics processing unit (GPU), a hardware processor core, or any combination thereof), a main memory 904 and a static memory 906, some or all of which may communicate with each other via an interlink (e.g., bus) 908. The machine 900 may further include a display unit 910, an alphanumeric input device 912 (e.g., a keyboard), and a user interface (UI) navigation device 914 (e.g., a mouse). In an example, the display unit 910, input device 912 and UI navigation device 914 may be a touch screen display. The machine 900 may additionally include a storage device (e.g., drive unit) 916, a signal generation device 918 (e.g., a speaker), a network interface device 920, and one or more sensors 921, such as a global positioning system (GPS) sensor, compass, position sensor system such as a position sensor system as discussed above, or other sensor. The machine 900 may include an output controller 928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 916 may include a machine readable medium 922 on which is stored one or more sets of data structures or instructions 924 (e.g., software) embodying or utilized by any one or more of the techniques or functions described herein.

The instructions 924 may also reside, completely or at least partially, within the main memory 904, within static memory 906, or within the hardware processor 902 during execution thereof by the machine 900. In an example, one or any combination of the hardware processor 902, the main memory 904, the static memory 906, or the storage device 916 may constitute machine readable media.

While the machine readable medium 922 is illustrated as a single medium, the term "machine readable medium" may include a single medium or multiple media (e.g., a centralized or distributed database, and/or associated caches and servers) configured to store the one or more instructions 924.

The term "machine readable medium" may include any medium that is capable of storing, encoding, or carrying instructions for execution by the machine 900 and that cause the machine 900 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 924 may further be transmitted or received over a communications network 926 using a transmission medium via the network interface device 920 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi IEEE 802.16 family of standards known as WiMax®), IEEE 802.15.4 family of standards, peer-to-peer networks, among others. In an example, the network interface device 920 may include one or more physical jacks (e.g., Ethernet, coaxial, or phone jacks) or one or more antennas to connect to the communications network 926. In an example, the network interface device 920 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 900, and includes digital or analog communications signals or other intangible medium to facilitate communication of such software.

VARIOUS NOTES & EXAMPLES

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A system for providing position information of a first structure with respect to a second structure, the system comprising:
    a magnet; and
    a first magnetic field direction sensor, positioned between the magnet and a magnetic feature of one of the first structure or the second structure, configured to move with the magnet and to measure a direction of a magnetic field produced by the magnet relative to a first axis (–) and a second axis in a plane defined by the first and second axes, a change in the magnetic field providing position information;
    wherein the magnetic feature is configured to change position with respect to the magnetic sensor along the first axis as a relative position between the magnet and the magnetic feature changes with respect to a second axis; and
    wherein the first magnetic field direction sensor is located off-center of the magnet along the first axis.

2. The system of claim 1, wherein the first axis is perpendicular to the second axis.

3. The system of claim 1, wherein the first magnetic sensor is offset from a planer midpoint of the magnet in the second direction;
    wherein a plane of the planar mid-point is defined by the first axis and a third axis; and
    wherein the third axis is perpendicular to both the first axis and the second axis.

4. The system of claim 3, wherein the first magnetic sensor is configured to measure an angle of the magnetic field direction in a second plane defined by the first axis and the second axis.

5. The system of claim 1, wherein the magnetic feature is a magnetic property discontinuity.

6. The system of claim 1, wherein the magnetic feature is an edge of a structure.

7. The system of claim 6, wherein the structure is a ferromagnetic material.

8. The system of claim 6, wherein the structure includes an opening, and the edge is a side of the opening.

9. The system of claim 1, including a second magnetic field direction sensor.

10. The system of claim 9, including a second magnetic feature configured to influence a direction of the magnetic field at the second magnetic field direction sensor as the magnet, the first magnetic field direction sensor and the second magnetic field direction sensor change position along the second axis with respect to the first and second magnetic features.

11. The system of claim 10, wherein the first axis is a radial axis extending from a center point, and the second axis is a rotational axis about the center point.

12. The system of claim 9, wherein a relative position between the first magnetic feature and the second magnetic feature at a first common end of the first and second magnetic features is larger than the relative position between the first magnetic feature and the second magnetic feature at a second common end of the first and second magnetic features; and
    wherein the first common end is distal from the second common end along the second axis.

13. The system of claim 12, wherein the first axis is perpendicular to the second axis.

14. The system of claim 1, wherein the first axis is a radial axis extending from a center point, and the second axis is a rotational axis about the center point.

15. A method of determining position along a first axis using magnetic field direction in a plane defined by the first axis and a second axis, the method comprising:
    changing a position, along the first axis, of a magnet and a magnetic field direction sensor with respect to a magnetic feature to provide a change in relative position, the magnetic feature configured to change position relative to the magnet and the magnetic field direction sensor along a second axis as the relative position changes along the first axis, wherein the magnetic field direction sensor is located off-center of the magnet along the first axis;
    detecting a change in a magnetic field direction of a magnetic field of the magnet in the plane defined by the first axis and the second axis using the magnetic field direction sensor, wherein the first axis is perpendicular to the second axis, and wherein the change in magnetic field direction is commensurate with the change in relative position; and
    providing position information of the magnet relative to the magnetic feature along the first axis using an output of the magnetic field direction sensor.

16. The method of claim 15, including:
    differentiating the position information at a control circuit to provide velocity information of the change in position of the magnetic field direction sensor along the first axis; and
    differentiating the velocity information at the control circuit to provide acceleration information of the change in relative position of the magnetic field direction sensor along the first axis.

17. The method of claim 15, wherein the first axis is a rotational axis about a central axis extending in a third direction parallel to the plane.

18. The method of claim 17, wherein the second axis is a radial axis extending form the central axis.

* * * * *